United States Patent
Kim et al.

(10) Patent No.: US 10,474,593 B2
(45) Date of Patent: Nov. 12, 2019

(54) MEMORY DEVICE COMMUNICATING WITH SYSTEM ON CHIP THROUGH AT LEAST TWO CHANNELS, ELECTRONIC DEVICE INCLUDING THE SAME, AND OPERATING METHOD OF ELECTRONIC DEVICE

(71) Applicant: Samsung Electronics Co., Ltd., Suwon-si, Gyeonggi-do (KR)

(72) Inventors: Kwanghyun Kim, Seongnam-si (KR); Ki-Seok Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/006,082

(22) Filed: Jun. 12, 2018

(65) Prior Publication Data

US 2019/0163650 A1 May 30, 2019

(30) Foreign Application Priority Data

Nov. 29, 2017 (KR) .......................... 10-2017-0161959

(51) Int. Cl.
| | |
|---|---|
| G06F 13/16 | (2006.01) |
| G11C 7/10 | (2006.01) |
| G06F 13/40 | (2006.01) |
| G06F 3/06 | (2006.01) |
| H01L 25/065 | (2006.01) |

(52) U.S. Cl.
CPC ........ *G06F 13/1678* (2013.01); *G06F 3/0613* (2013.01); *G06F 3/0659* (2013.01); *G06F 3/0679* (2013.01); *G06F 13/4068* (2013.01); *G11C 7/1075* (2013.01); *H01L 25/0657* (2013.01); *H01L 2225/06541* (2013.01)

(58) Field of Classification Search
CPC .. G06F 3/0659; G06F 3/0613; G06F 13/1678; G06F 13/364; G06F 13/4068; G11C 7/1075; G11C 7/1039
See application file for complete search history.

(56) References Cited

U.S. PATENT DOCUMENTS

| 6,961,269 B2 | 11/2005 | Royer |
| 8,918,594 B2 | 12/2014 | Albini et al. |
| 9,489,329 B2 | 11/2016 | Lakshmanamurthy et al. |

(Continued)

FOREIGN PATENT DOCUMENTS

| KR | 101329930 B | 11/2013 |
| KR | 1020150091663 A | 8/2015 |

*Primary Examiner* — Ernest Unelus
(74) *Attorney, Agent, or Firm* — Harness, Dickey & Pierce, P.L.C.

(57) ABSTRACT

An electronic device includes a memory and a system on chip (SoC). The memory device includes a first memory cell area assigned to a first channel and a second memory cell area assigned to a second channel. The SoC includes a first processing unit and a second processing unit. The first processing unit is configured to transmit a first command for accessing the first memory cell area to the memory device through the first channel. The second processing unit is configured to transmit a second command for accessing the second memory cell area to the memory device through the second channel. The memory device is configured such that a bandwidth of the first channel and a bandwidth of the second channel are different from each other.

20 Claims, 9 Drawing Sheets

(56) References Cited

U.S. PATENT DOCUMENTS

| | | | |
|---|---|---|---|
| 9,811,460 B2 | 11/2017 | Jeon et al. | |
| 2007/0214335 A1* | 9/2007 | Bellows | G11C 7/1012 |
| | | | 711/167 |
| 2010/0228923 A1 | 9/2010 | Lim | |
| 2015/0081989 A1* | 3/2015 | Lee | G06F 12/0607 |
| | | | 711/157 |
| 2015/0286529 A1 | 10/2015 | Lunde | |
| 2015/0286565 A1 | 10/2015 | De et al. | |
| 2017/0068464 A1 | 3/2017 | Crawford, Jr. | |
| 2017/0123670 A1 | 5/2017 | Jayasena et al. | |
| 2017/0285941 A1* | 10/2017 | Nale | G06F 13/16 |

* cited by examiner

MEMORY DEVICE COMMUNICATING WITH SYSTEM ON CHIP THROUGH AT LEAST TWO CHANNELS, ELECTRONIC DEVICE INCLUDING THE SAME, AND OPERATING METHOD OF ELECTRONIC DEVICE

CROSS-REFERENCE TO RELATED APPLICATIONS

This U.S. non-provisional patent application claims priority under 35 U.S.C. § 119 to Korean Patent Application No. 10-2017-0161959 filed on Nov. 29, 2017, in the Korean Intellectual Property Office, the disclosures of which are incorporated by reference herein in their entireties.

BACKGROUND

Example embodiments of the inventive concepts described herein relate to a memory device, an electronic device including the same, and an operating method of the electronic device, and more particularly, relate to a memory device communicating with a system on chip through at least two channels, an electronic device including the same, and an operating method of the electronic device.

An application processor (AP) may be implemented in the form of a system on chip (hereinafter referred to as a "SoC"). The SoC may be one chip in which various systems are integrated. Since various systems are integrated in the SoC, the SoC may be used in an application in which the number of chips to be mounted is limited. The SoC may include an internal memory (e.g., a static random access memory (SRAM)) or may communicate with an external memory device (e.g., a dynamic random access memory (DRAM)), the capacity of which is greater than a capacity of the internal memory. Unlike the internal memory of the SoC, a kind of the external memory device communicating with the SoC may be varied.

The number of processing units to be included in the SoC may increase as functions that the SoC supports become more varied. In the case where the SoC and various kinds of memory devices are connected for a plurality of processing units, the size and costs of the electronic device may increase. Accordingly, there is a need to connect the SoC and a memory device with a small size and low costs.

SUMMARY

Example embodiments of the inventive concepts provide a memory device communicating with a system on chip through at least two channels, an electronic device including the same, and an operating method of the electronic device.

According to an example embodiment an electronic device may include a memory and a system on chip (SoC). The memory device may include a first memory cell area assigned to a first channel and a second memory cell area assigned to a second channel. The SoC may include a first processing unit and a second processing unit. The first processing unit may be configured to transmit a first command for accessing the first memory cell area to the memory device through the first channel. The second processing unit may be configured to transmit a second command for accessing the second memory cell area to the memory device through the second channel. The memory device may be configured such that a bandwidth of the first channel and a bandwidth of the second channel are different from each other.

According to another example embodiment a memory device may include a memory cell a first peripheral unit and a second peripheral unit. A memory cell array may include a first memory cell area and a second memory cell area. The first peripheral circuit may be configured to access the first memory cell area, in response to a first command transmitted from a system on chip (SoC) through a first channel. The second peripheral circuit may be configured to access the second memory cell area, in response to a second command transmitted from the SoC through a second channel. The first peripheral circuit may include first data input/output pins. The first peripheral circuit may be configured to exchange first data with the SoC by inputting or outputting the first data through the first input/output pins. The second peripheral circuit may include second data input/output pins. The second peripheral circuit maybe configured to exchange second data with the SoC by inputting or outputting the second data through the second input/output pins. The first peripheral circuit and the second peripheral circuit may be configured such that a first bandwidth of the first channel and a second bandwidth of the second channel are different from each other.

According to another Example embodiment a memory device may include a first memory cell area assigned to a first channel, a second memory cell area assigned to a second channel, a first set of input output pins and a second set of input output pins. The first set of input/output pins may be configured to input or output first data through the first channel with a first bandwidth. The second set of input/output pins may configured to input or output second data through the first channel with a second bandwidth, the second bandwidth being different from the first bandwidth.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, example embodiments of the inventive concepts may be described in detail and clearly to such an extent that one having ordinary skill in the art may easily implement the inventive concepts.

Figure 1:
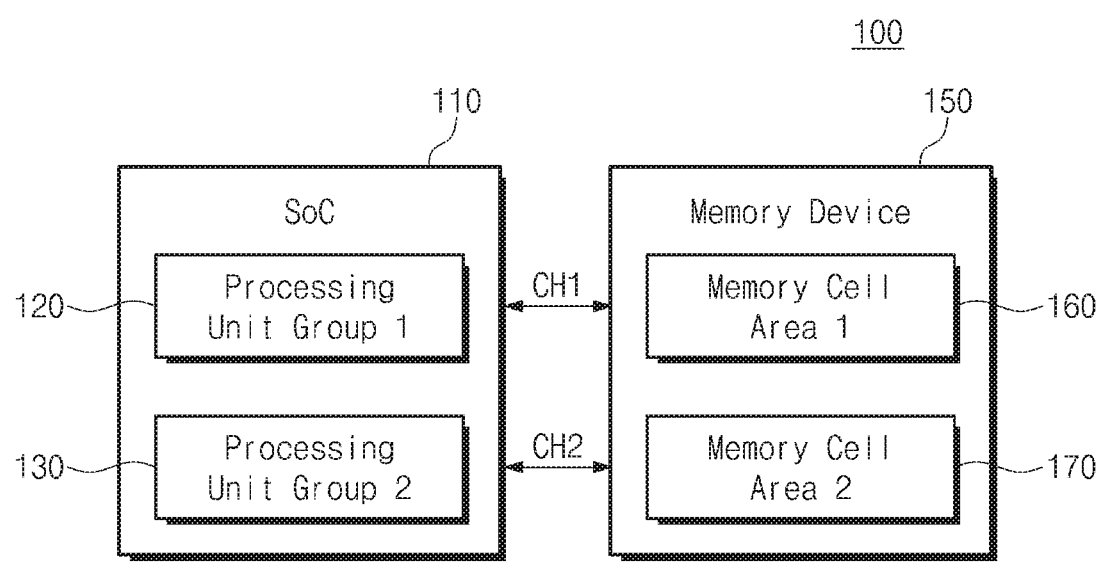
FIG. 1 is a block diagram illustrating an electronic device according to an example embodiment of the inventive concepts.

FIG. 1 is a block diagram illustrating an electronic device according to an example embodiment of the inventive concepts. Referring to FIG. 1, an electronic device 100 may include a system on chip (hereinafter referred to as a "SoC") 110 and a memory device 150.

The SoC 110 that is an application processor (AP) may include intellectual property (IP) blocks performing various operations, for various applications, which the electronic device 100 supports, such as virtual reality (VR), augmented reality (AR), mixed reality (MR), and the like. The IP blocks may be implemented in the form of hardware in the SoC 110. For example, the SoC 110 may include a first processing unit group 120 and a second processing unit group 130. Here, the number of processing unit groups may be only exemplary.

The first processing unit group 120 may include processing units communicating with a general-purpose DRAM, such as a double data rate synchronous dynamic random access memory (DDR SDRAM), DDR2 SDRAM, DDR3 SDRAM, DDR4 SDRAM, DDR5 SDRAM, LPDDR (low power double data rate) SDRAM, LPDDR2 SDRAM, LPDDR3 SDRAM, LPDDR4 SDRAM, LPDDR4× SDRAM, LPDDR5 SDRAM, or the like. For example, the first processing unit group 120 may include at least one of a central processing unit (CPU), an image signal processing unit (ISP), and a digital signal processing unit (DSP).

The second processing unit group 130 may support applications different from applications that the first processing unit group 120 supports. For example, the amount of computation necessary for an application that the second processing unit group 130 supports may be greater than the amount of computation necessary for an application that the first processing unit group 120 supports. That is, the second processing unit group 130 may include processing units communicating with a high-performance DRAM, the bandwidth of which is higher than a bandwidth of the general-purpose DRAM, such as a graphics double data rate (GDDR) synchronous graphics random access memory (SGRAM), GDDR2 SGRAM, GDDR3 SGRAM, GDDR4 SGRAM, GDDR5 SGRAM, GDDR6 SGRAM, a high bandwidth memory (HBM), HBM2, HBM3, and the like. For example, the second processing unit group 130 may include at least one of a graphics processing unit (GPU), a vision processing unit (VPU), and a neural processing unit (NPU).

According to an example embodiment of the inventive concepts, instead of including various kinds of memory devices for the respective first and second processing unit groups 120 and 130, the computation capacity of each being different, the electronic device 100 may include the one memory device 150 that supports both the first processing unit group 120 and the second processing unit group 130 through a first channel CH1 and a second channel CH2. Also, unlike illustration of FIG. 1, even in the case where the SoC 110 includes three or more processing unit groups, the one memory device 150 may support the three or more processing unit groups through three or more channels.

The first processing unit group 120 may communicate with the memory device 150 through the first channel CH1, and the second processing unit group 130 may communicate with the memory device 150 through the second channel CH2. Characteristics of first data input/output between the first processing unit group 120 and the memory device 150 through the first channel CH1 may be different from characteristics of second data input/output between the second processing unit group 130 and the memory device 150 through the second channel CH2. A transmission speed (or a transmission rate) of the first channel CH1 may be different from a transmission speed of the second channel CH2, and a bandwidth of the first channel CH1 may be different from a bandwidth of the second channel CH2. For example, the bandwidth of the second data input/output may be higher than the bandwidth of the first input/output. The bandwidth may increase as the number of input/output pins (e.g., DQ pins) assigned to a channel increases or a transmission speed of each input/output pin becomes higher.

The memory device 150 may include a first memory cell area 160 assigned to the first channel CH1 and a second memory cell area 170 assigned to the second channel CH2. In the case where the SoC 110 and the memory device 150 communicate with each other through three or more channels, the memory device 150 may assign memory cell areas to the three or more channels, respectively.

In an example embodiment, capacities of the first memory cell area 160 and the second memory cell area 170 may be changed depending on a request of the SoC 110 or may be different from each other. However, since partial areas of a memory cell array of the memory device 150 are respectively assigned to the first memory cell area 160 and the second memory cell area 170 depending on the request of the SoC 110, the capacity of the memory cell array may be fixed. That is, the total capacity of the memory device 150 may be fixed.

The memory cell array is an area in which memory cells are repeatedly disposed. For example, a memory cell may include at least one of a DRAM cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, and a magnetic random access memory (MRAM) cell. For example, a kind of memory cells of the first memory cell area 160 may be the same as or different from a kind of memory cells of the second memory cell area 170.

The first processing unit group 120 may be configured to transmit a first command for accessing the first memory cell area 160 to the memory device 150 through the first channel CH1. The second processing unit group 130 may be configured to transmit a second command for accessing the second memory cell area 170 to the memory device 150 through the second channel CH2.

Figure 2:
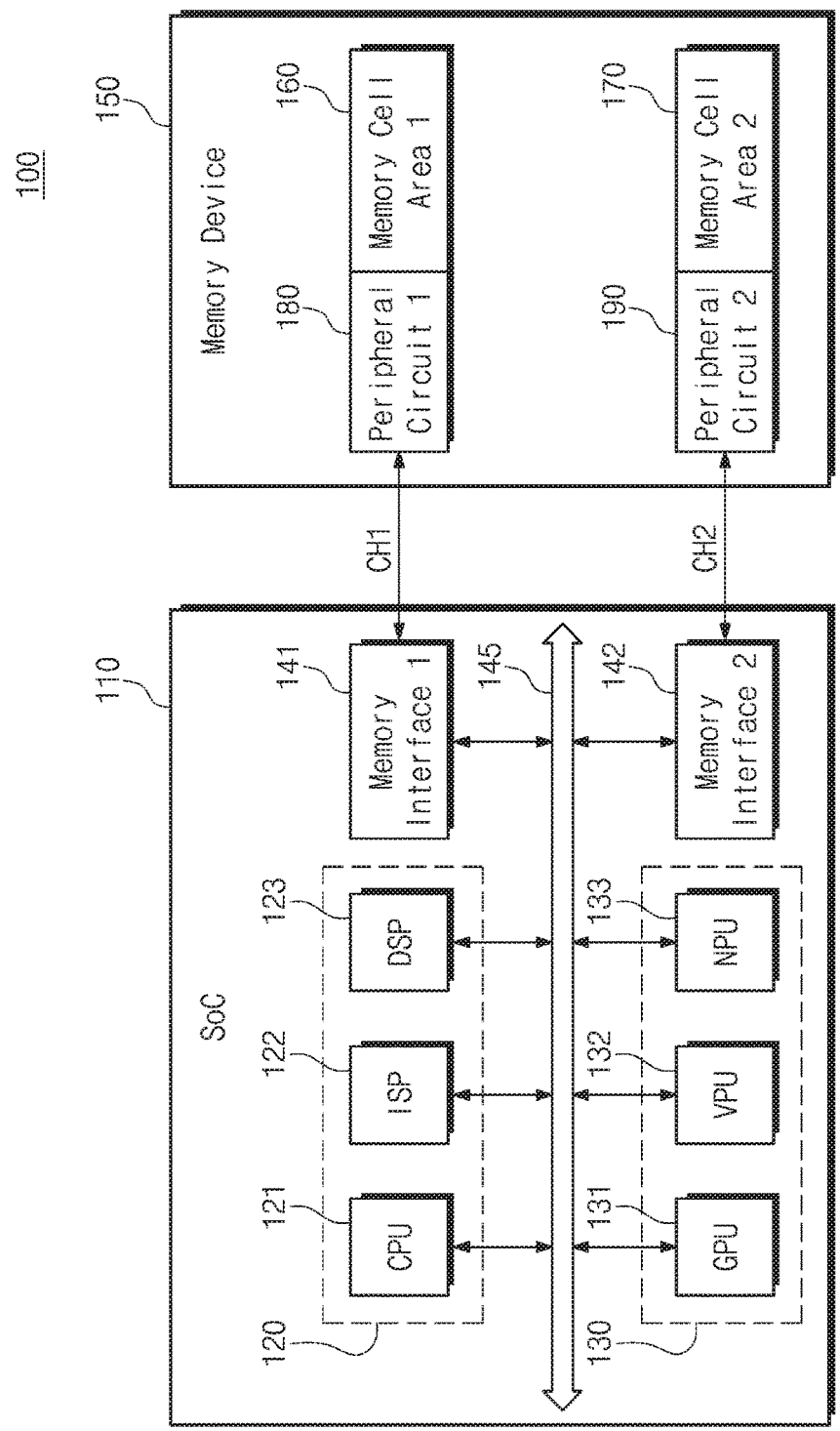
FIG. 2 is a block diagram illustrating the electronic device of FIG. 1.

FIG. 2 is a block diagram illustrating an electronic device of FIG. 1. Referring to FIG. 2, the SoC 110 may include the first processing unit group 120, the second processing unit group 130, a first memory interface 141, a second memory interface 142, and a bus 145.

The first processing unit group 120 may include a CPU 121, an ISP 122, and a DSP 123. The CPU 121 may include one or more cores (e.g., a multi-core), which are homogeneous processor cores or heterogeneous processor cores. The cores may operate independently of each other. The ISP 122 may be a processor used to recognize and analyze an image. The DSP 123 may be a processor that processes a digital signal at high speed for reducing the load of the CPU 121. Unlike illustration of FIG. 2, the first processing unit group 120 may include only a part of the CPU 121, the ISP 122, and the DSP 123 or may further include another processor.

The second processing unit group 130 may include a GPU 131, a VPU 132, and an NPU 133. The GPU 131 may be a graphics processing dedicated processor for improving graphic performance. The VPU 132 may be a processor for executing machine vision algorithms such as convolution neural networks (CNN), scale-invariant feature transform (SIFT), and the like. The NPU 133 may be a processor for implementing an artificial neural network. Unlike illustration of FIG. 2, the second processing unit group 130 may include only a part of the GPU 131, the VPU 132, and the NPU 133 or may further include a dedicated processor for only a specific purpose.

The first memory interface 141 may provide an interface for performing communication through the first channel CH1. The first memory interface 141 may transmit data provided by the first processing unit group 120 to a first peripheral circuit 180 or may transmit data provided from the first peripheral circuit 180 to the first processing unit group 120. The first memory interface 141 may perform a function of a memory controller for controlling the first memory cell area 160 of the memory device 150 in response to a request of the first processing unit group 120.

The second memory interface 142 may provide an interface for performing communication through the second channel CH2. The second memory interface 142 may transmit data provided by the second processing unit group 130 to a second peripheral circuit 190 or may transmit data provided from the second peripheral circuit 190 to the second processing unit group 130. The second memory interface 142 may perform a function of a memory controller for controlling the second memory cell area 170 of the memory device 150 in response to a request of the second processing unit group 130.

In an example embodiment, each of the first and second memory interfaces 141 and 142 may operate depending on one or more of the following: universal serial bus (USB), small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), universal flash storage (UFS), and the like.

The bus 145 may provide a data input/output path between the first processing unit group 120, the second processing unit group 130, the first memory interface 141, and the second memory interface 142. For example, the bus 145 may be implemented with an advanced microcontroller bus architecture (AMBA), an advanced high-performance bus (AHB), an advanced peripheral bus (APB), an advanced eXtensible interface (AXI), an advanced system bus (ASB), or AXI coherency extensions (ACE), or a combination thereof, but the bus 145 may not be limited thereto.

The memory device 150 may include the first memory cell area 160, the second memory cell area 170, the first peripheral circuit 180 for accessing the first memory cell area 160, and the second peripheral circuit 190 for accessing the second memory cell area 170. The first peripheral circuit 180 may access the first memory cell area 160 in response to a command transmitted from the SoC 110 through the first channel CH1. As in the above description, the second peripheral circuit 190 may access the second memory cell area 170 in response to a command transmitted from the SoC 110 through the second channel CH2.

In an example embodiment, the memory device 150 may include not one peripheral circuit but two peripheral circuits (i.e., the first peripheral circuit 180 and the second peripheral circuit 190) for one memory cell array including the first memory cell area 160 and the second memory cell area 170. Also, an access speed at which the first peripheral circuit 180 accesses the first memory cell area 160 may be different from an access speed at which the second peripheral circuit 190 accesses the second memory cell area 170. Below, the memory device 150 will be more fully described.

Figure 3:
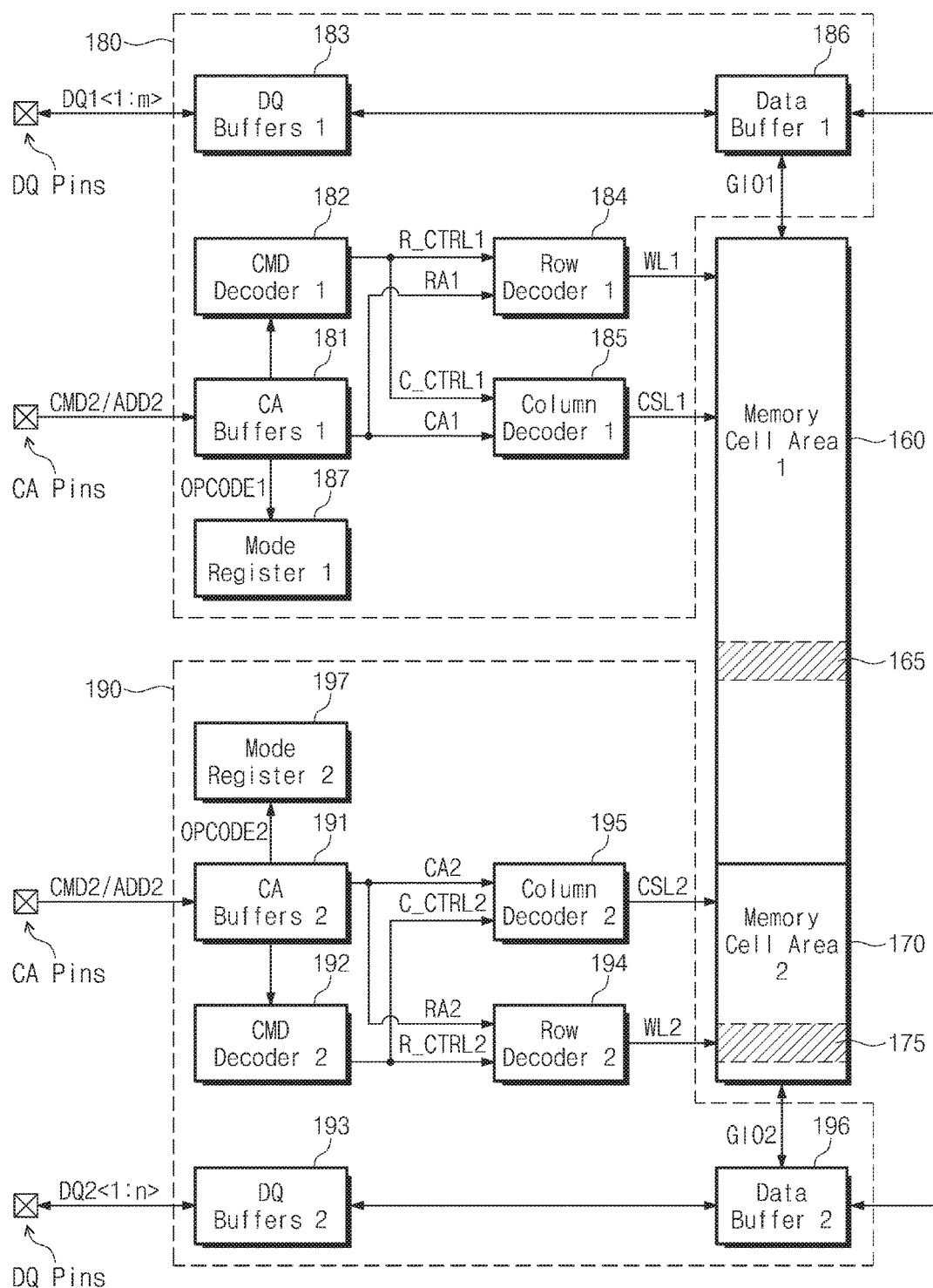
FIG. 3 is a block diagram illustrating a memory device of FIG. 2.

FIG. 3 is a block diagram illustrating a memory device of FIG. 2. FIG. 3 will be described with reference to FIGS. 1 and 2. Referring to FIG. 3, the memory device 150 may include the first memory cell area 160, the second memory cell area 170, the first peripheral circuit 180, and the second peripheral circuit 190. The first peripheral circuit 180 may include first command/address buffers 181, a first command decoder 182, first DQ buffers 183, a first row decoder 184, a first column decoder 185, a first data buffer 186, and a first mode register 187. The second peripheral circuit 190 may include second command/address buffers 191, a second command decoder 192, second DQ buffers 193, a second row decoder 194, a second column decoder 195, a second data buffer 196, and a second mode register 197.

Each of the first memory cell area 160 and the second memory cell area 170 may be a portion of a memory cell array. For example, one memory cell array including the first memory cell area 160 and the second memory cell area 170 may correspond to one bank or may configure the one bank. Only one bank is illustrated in FIG. 3, but the number of banks of the memory device 150 is not limited thereto. For example, the number and the capacity of banks may be determined depending on the JEDEC (joint electron device engineering council) standard.

The first command/address buffers 181 may receive and store a first command/address CMD1/ADD1 from the outside (e.g., the SoC 110 of FIGS. 1 and 2) of the memory device 150. The first command/address CMD1/ADD1 may be transmitted through the first channel CH1 described with reference to FIGS. 1 and 2. In detail, the first command/address buffers 181 may receive and store an activation command, a write command, a read command, a precharge command, a refresh command, a mode register set (MRS) command, and the like and may receive and store a bank address, a row address, a column address, an operation code, and the like together with the above-described commands.

The first command/address buffers 181 may provide a first row address RA1 to the first row decoder 184, may provide a first column address CA1 to the first column decoder 185, and may provide a first operation code OPCODE1 to the first mode register 187. Here, the first operation code OPCODE1 may be referred to as a "setting value" of the first mode register 187.

For example, the first peripheral circuit 180 may receive the first command/address CMD1/ADD1 through one or more first command/address (CA) pins. In this case, the number of first command/address buffers 181 may be the same as the number of first command/address pins.

The first command decoder 182 may receive and decode the first command CMD1 from the first command/address buffers 181. For example, in the case where the memory device 150 is a DRAM device, the first command decoder 182 may decode an activation command, a write command, a read command, a precharge command, a refresh command, an MRS command, and the like.

The first command decoder 182 may control the first row decoder 184 depending on the activation command, the precharge command, or the refresh command. The first command decoder 182 may control the first column decoder 185 depending on the write command or the read command. The first command decoder 182 may provide a first row control signal R_CTRL1 to the first row decoder 184 and may provide a first column control signal C_CTRL1 to the first column decoder 185. Although not illustrated in FIG. 3, the first command decoder 182 may control any other components for accessing the first memory cell area 160.

The first DQ buffers 183 may drive a first data input/output (DQ) pins, respectively. The first DQ buffers 183 may receive write data from the first data input/output pins and may provide the write data to the first data buffer 186. The first DQ buffers 183 may receive read data output from the first data buffer 186 and may drive the first data input/output pins depending on the read data. The first data input/output pins may be pins configured to input or output exchanged data between the SoC 110 and the first memory cell area 160 through the first channel CH1.

For example, the first peripheral circuit 180 and the SoC 110 of FIGS. 1 and 2 may exchange first data input/output signals DQ1<1:m> with each other. Here, "m" may be a natural number, and a bandwidth of first data input/output through a first channel may become higher as "m" becomes higher. The first peripheral circuit 180 may include "m" first data input/output pins and "m" first data input/output buffers for the first data input/output signals DQ1<1:m>.

The first row decoder 184 may receive the first row control signal R_CTRL1 from the first command decoder 182 and the first row address RA1 from the first command/address buffers 181 and may select a first word line WL1, based on the first row control signal R_CTRL1 and the first row address RA1. The first column decoder 185 may receive the first column control signal C_CTRL1 from the first command decoder 182 and the first column address CA1 from the first command/address buffers 181 and may select a first column select line CSL1, based on the first column control signal C_CTRL1 and the first column address CA1.

The first data buffer 186 may receive the write data from the first DQ buffers 183. The first data buffer 186 may transmit the write data to memory cells selected by the first row decoder 184 and the first column decoder 185. To this end, the first data buffer 186 may drive first global input/output lines GIO1 and selected memory cells depending on the write data.

The first data buffer 186 may receive the read data output from the memory cells selected by the first row decoder 184 and the first column decoder 185. To this end, the first data buffer 186 may sense and amplify voltages of the first global input/output lines GIO1, which is determined depending on the read data. The first data buffer 186 may provide the read data to the first DQ buffers 183.

The first mode register 187 may store setting values for various operation modes that the memory device 150 supports. The first mode register 187 may include one or more mode registers. The SoC 110 may set various operation modes of the memory device 150 by using the setting values stored in the first mode register 187. The SoC 110 may transmit a first mode register set (MRS) command and the first operation code OPCODE1 to the first peripheral circuit 180 through the first channel CH1. In the case where the setting value are stored or updated in the first mode register 187, various operation modes for the first memory cell area 160 may be set.

For example, the setting of various operation modes may include operations of setting a burst length, setting a read burst type, setting a column address strobe (CAS) latency, setting delay locked loop (DLL) enable or reset, setting a write recovery (WR) and read to precharge (RTP), setting an additive latency (AL), setting RTT_NOM, RTT_WR, and RTT_PARK, setting impedance control of an output driver, setting write leveling, setting TDQS enable, setting write cyclical redundancy checks (CRC), setting a refresh operation, setting a CAS write latency (CWL), setting a multipurpose register (MPR), setting a temperature sensor, setting a geardown mode, setting write and read preamble, setting a reference voltage (Vref), setting power-down, setting data bus inversion (DBI), setting data mask, setting on die termination (ODT), setting parity, setting ZQ calibration, and the like.

The components (the second command/address buffers 191, the second command decoder 192, the second DQ buffers 193, the second row decoder 194, the second column decoder 195, the second data buffer 196, and the second mode register 197) of the second peripheral circuit 190 may operate to be similar to the components (the first command/address buffers 181, the first command decoder 182, the first DQ buffers 183, the first row decoder 184, the first column decoder 185, the first data buffer 186, and the first mode register 187) of the first peripheral circuit 180.

However, the second peripheral circuit 190 is a circuit for accessing the second memory cell area 170, and the first peripheral circuit 180 is circuit for accessing the first memory cell area 160. Also, an access speed at which the second peripheral circuit 190 accesses the second memory cell area 170 may be different from an access speed at which the first peripheral circuit 180 accesses the first memory cell area 160. The number of second data input/output signals DQ 2<1:n> that the second peripheral circuit 190 and the SoC 110 exchange with each other may be different from the number of first data input/output signals DQ1<1:m> that the first peripheral circuit 180 and the SoC 110 exchange with each other. That is, the number of second data input/output pins may be different from the number of first data input/output pins.

Second DQ buffers 193 may drive a second data input/output (DQ) pins, respectively. The second DQ buffers 193 may receive write data from the second data input/output pins and may provide the write data to the second data buffer 196. The second DQ buffers 193 may receive read data output from the second data buffer 196 and may drive the second data input/output pins depending on the read data. The second data input/output pins may be pins configured to input or output exchanged data between the SoC 110 and the second memory cell area 170 through the second channel CH2.

In an example embodiment, memory cells of the first memory cell area 160 and memory cells of the second memory cell area 170 may be implemented to be the same as each other. However, an access speed of the second peripheral circuit 190 may be higher than an access speed of the first peripheral circuit 180. That is, a latency of the second memory cell area 170 may be lower than a latency of the first memory cell area 160. Here, in the case where the memory cell array includes DRAM cells, the latency may mean tRCD (RAS to CAS delay), tRP (row precharge time), tRAS (row active time), tRC (row cycle time), tRRD (RAS to RAS delay), tRFC (refresh cycle time), tWR (write recovery time), tWTR (write to read delay), CL (CAS latency), tCCD (CAS to CAS delay), or the like. For example, the access speed of the second peripheral circuit 190 may be higher than the access speed of the first peripheral circuit 180, but the capacity of the second memory cell area 170 may be smaller than the capacity of the first memory cell area 160.

In an example embodiment, the number of second data input/output pins of the second peripheral circuit 190 may be more than the number of first data input/output pins of the first peripheral circuit 180. Accordingly, a bandwidth of data input/output between the SoC 110 and the memory device 150 performed through the second channel CH2 may be higher than a bandwidth of data input/output between the SoC 110 and the memory device 150 performed through the first channel CH1.

In an example embodiment, a transmission speed at which data are transmitted through the second data input/output pins may be higher than a transmission speed at which data are transmitted through the first data input/output pins. That is, an operation speed of the second DQ buffers 193 may be higher than an operation speed of the first DQ buffers 183. To sum up, the second peripheral circuit 190 may provide a higher access speed (or a low latency) and a higher bandwidth than the first peripheral circuit 180, to the SoC 110.

In an example embodiment, in the case where the memory device 150 communicates with the SoC 110 through three or more channels, the memory cell array may be divided into three or more memory cell areas depending on the number of channels between the memory device 150 and the SoC 110, and peripheral circuits for the respective memory cell areas may be included in the memory device 150. For example, the number of peripheral circuits may be the same as the number of channels.

In an example embodiment, the first peripheral circuit 180 may include the first mode register 187, and the second peripheral circuit 190 may include the second mode register 197. Accordingly, the SoC 110 may independently set operation modes for the first memory cell area 160 and operation modes for the second memory cell area 170.

For example, the SoC 110 may independently set burst lengths for the first and second channels CH1 and CH2. In the case of a conventional memory device, a cache line size may be fixed to 64 bytes. However, each of the first processing unit group 120 and the second processing unit group 130 of FIGS. 1 and 2 may require a chunk size, which is smaller or greater than 64 bytes, according to an application. Accordingly, the memory device 150 may differently set burst lengths for the first to second channels CH1 and CH2 depending on a request of the SoC 110. To this end, the first and second mode registers 187 and 197 may respectively store setting values for setting a first burst length for the first channel CH1 and a second burst length for the second channel CH2.

In an example embodiment, the SoC 110 may set the capacity of the first memory cell area 160 assigned to the first channel CH1 and the capacity of the second memory cell area 170 assigned to the second channel CH2. For example, the SoC 110 may transmit an MRS command (i.e., a command for setting the capacity of the first memory cell area 160) to the memory device 150 through the first channel CH1 and may transmit an MRS command (i.e., a command for setting the capacity of the second memory cell area 170) to the memory device 150 through the second channel CH2.

The memory device 150 may set the capacity of the first memory cell area 160 and the capacity of the second memory cell area 170 or may change previously set capacities, based on the setting values of the first and second mode registers 187 and 197. For example, the capacities (i.e., the capacities of the first and second memory cell areas 160 and 170) respectively assigned to the first and second channels CH1 and CH2 depending on setting values OP[k] (k being an integer number) are provided in table 1.

TABLE 1

| OP[k] | Capacity assigned to first channel CH1 | Capacity assigned to second channel CH2 |
|---|---|---|
| 0 | 960 MB | 64 MB |
| 1 | 896 MB | 128 MB |
| 2 | 768 MB | 256 MB |
| 3 | 512 MB | 512 MB |

The total capacity of the memory cell array including the first memory cell area 160 and the second memory cell area 170 may be, for example, 1 GB regardless of the setting values. However, the capacity of the first memory cell area 160, the capacity of the second memory cell area 170, and the capacity of the memory cell array including the first memory cell area 160 and the second memory cell area 170 may not be limited to capacities of table 1. The first and second mode registers 187 and 197 may respectively store setting values for deciding the capacity of the first memory cell area 160 and the capacity of the second memory cell area 170.

In an example embodiment, based on the setting values of the first mode register 187, the first row decoder 184, the first column decoder 185, and the first data buffer 186 may respectively access word lines, column select lines, and input/output lines for accessing the first memory cell area 160. That is, a range of a row address value to be decoded by the first row decoder 184 may be determined depending on the setting values of the first mode register 187, and a range of a column address value to be decoded by the first column decoder 185 may also be determined depending on the setting values of the first mode register 187. As in the above description, based on the setting values of the second mode register 197, the second row decoder 194, the second column decoder 195, and the second data buffer 196 may respectively access word lines, column select lines, and input/output lines for accessing the second memory cell area 170.

In an example embodiment, in response to a command of the SoC 110, the first peripheral circuit 180 and the second peripheral circuit 190 may copy data of the first memory cell area 160 to the second memory cell area 170 or may copy data of the second memory cell area 170 to the first memory cell area 160. In detail, data stored at a first location 165 may be copied to a second location 175 through the first data buffer 186 and the second data buffer 196. In contrast, data stored at the second location 175 may be copied to the first location 165 through the second data buffer 196 and the first data buffer 186. That is, the memory device 150 may support the first channel CH1 and the second channel CH2 and may internally exchange data of the first memory cell area 160 assigned to the first channel CH1 and data of the second memory cell area 170 assigned to the second channel CH2.

The memory device 150 may be configured such that the bandwidth of the second channel CH2 and the bandwidth of the first channel CH1 may be different from each other. Further, the first peripheral circuit 180 and the second peripheral circuit 190 may be configured such that the bandwidth of the second channel CH2 and the bandwidth of the first channel CH1 may be different from each other. Further still the input/output pins may be configured such that the bandwidth of the second channel CH2 and the bandwidth of the first channel CH1 may be different from each other.

Figure 4:
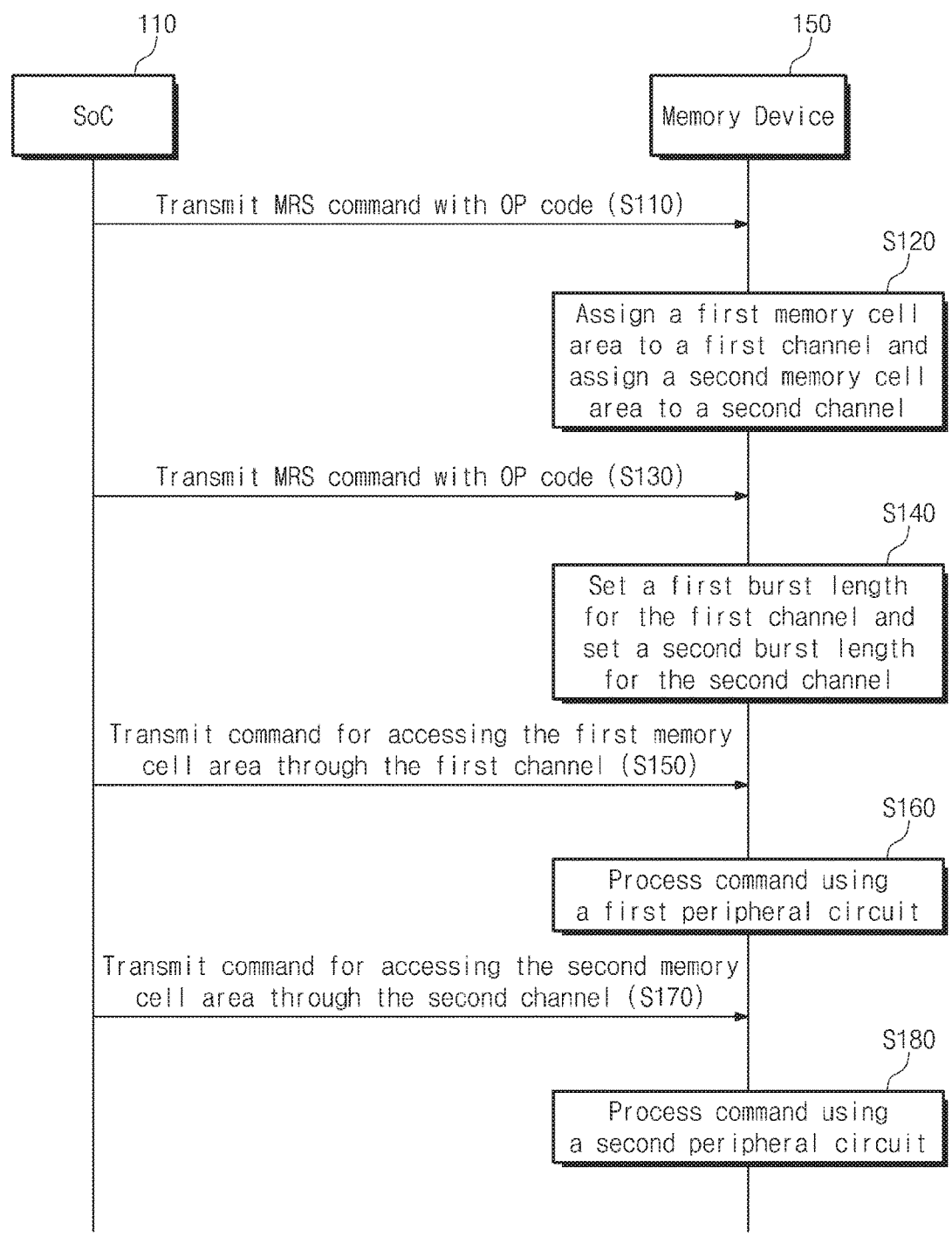
FIG. 4 is a flowchart illustrating an operating method of the electronic device according to an example embodiment of the inventive concepts.

FIG. 4 is a flowchart illustrating an operating method of an electronic device according to an example embodiment of the inventive concepts. FIG. 4 will be described with reference to FIGS. 1 to 3.

In operation S110, the SoC 110 may assign the first memory cell area 160 to the first channel CH1. The SoC 110 may assign the second memory cell area 170 to the second channel CH2. The SoC 110 may transmit an MRS command to the memory device 150 together with an operation code for area assignment. In detail, the first processing unit group 120 of the SoC 110 may transmit the MRS command to the first mode register 187 through the first channel CH1 together with the operation code. The second processing unit group 130 of the SoC 110 may transmit the MRS command to the second mode register 197 through the second channel CH2 together with the operation code.

In operation S120, the memory device 150 may assign the first memory cell area 160 to the first channel CH1 and the second memory cell area 170 to the second channel CH2, based on setting values transmitted to the first and second mode registers 187 and 197 in operation S110. In this case, the first row decoder 184, the first column decoder 185, and the first data buffer 186 may be set to access the first memory cell area 160. As in the above description, the second row decoder 194, the second column decoder 195, and the second data buffer 196 may be set to access the second memory cell area 170. For example, operation S110 and operation S120 may be repeated depending on a request of the SoC 110. That is, a portion of the first memory cell area 160 assigned to the first channel CH1 may be further assigned to the second channel CH2, or a portion of the second memory cell area 170 assigned to the second channel CH2 may be further assigned to the first channel CH1.

In operation S130, the SoC 110 may transmit the MRS command to the memory device 150 together with an operation code for setting a first burst length of the first channel CH1 and a burst length of the second channel CH2. As in the manner described in operation S110, the SoC 110 may transmit first and second operation codes to the first and second mode registers 187 and 197.

In operation S140, the memory device 150 may set the first burst length for the first channel CH1 and the second burst length for the second channel CH2, based on the setting values transmitted to the first and second mode registers 187 and 197 in operation S130.

In detail, the first row decoder 184, the first column decoder 185, and the first data buffer 186 may prefetch data from the first memory cell area 160, based on the first burst length set to the first mode register 187. As in the above description, the second row decoder 194, the second column decoder 195, and the second data buffer 196 may prefetch data from the second memory cell area 170, based on the second burst length set to the second mode register 197.

For example, operation S130 and operation S140 may be repeated depending on a request of the SoC 110. As in the description given in operation S110 and operation S130, the SoC 110 may set various operation modes of the memory device 150 for the first channel CH1 and the second channel CH2, by using the MRS command.

In operation S150, the first processing unit group 120 of the SoC 110 may transmit a command for accessing the first memory cell area 160 to the memory device 150 through the first channel CH1. In operation S160, the memory device 150 may process the command transmitted in operation S150 by using the first peripheral circuit 180. For example, the first peripheral circuit 180 may store write data in the first memory cell area 160 or may transmit read data read from the first memory cell area 160 to the first processing unit group 120 through the first channel CH1.

In operation S170, the second processing unit group 130 of the SoC 110 may transmit a command for accessing the second memory cell area 170 to the memory device 150 through the second channel CH2. In operation S180, the memory device 150 may process the command transmitted in operation S170 by using the second peripheral circuit 190. For example, the second peripheral circuit 190 may store write data in the second memory cell area 170 or may transmit read data read from the second memory cell area 170 to the second processing unit group 130 through the second channel CH2.

In an example embodiment, an operation where the first processing unit group 120 transmit a command through the first channel CH1 (operation S150) and an operation where the second processing unit group 130 transmit a command through the second channel CH2 (operation S160) may be performed independently of each other. Also, an operation where the first peripheral circuit 180 processes the command transmitted through the first channel CH1 (operation S160) and an operation where the second peripheral circuit 190 processes the command transmitted through the second channel CH2 (operation S180) may be performed independently of each other. For example, first data input/output that is based on a command transmitted to the memory device 150 through the first channel CH1 and second data input/output that is based on a command transmitted to the memory device 150 through the second channel CH2 may be performed independently of each other.

Figure 5:
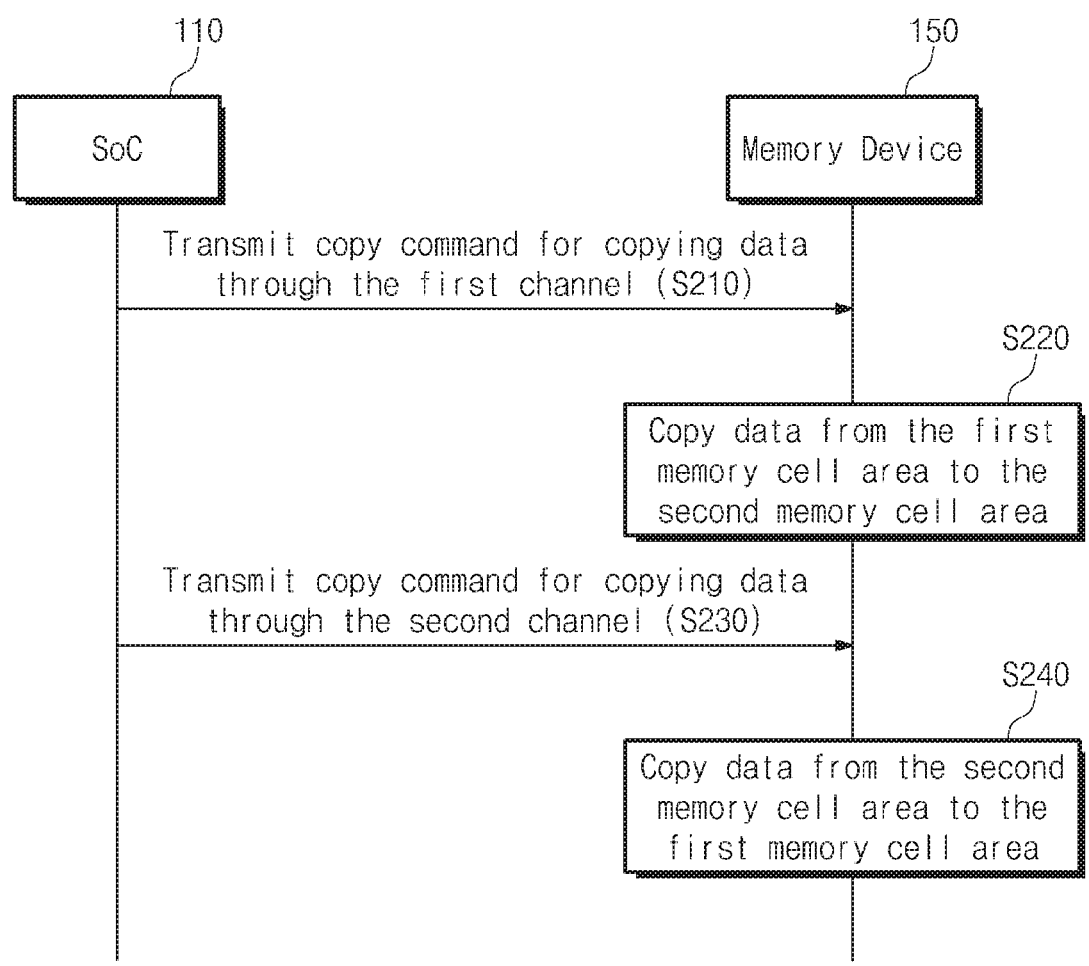
FIG. 5 is a flowchart illustrating an operating method of the electronic device according to another example embodiment of the inventive concepts.

FIG. 5 is a flowchart illustrating an operating method of an electronic device according to another example embodiment of the inventive concepts. FIG. 5 will be described with reference to FIGS. 1 to 3.

In operation S210, the SoC 110 may transmit a copy command for copying data from the first memory cell area 160 to the second memory cell area 170 to the memory device 150 through the first channel CH1 . For example, the copy command may be a command defined in advance between the SoC 110 and the memory device 150 or a vendor-specific command. In an example embodiment, the first processing unit group 120 may transmit the copy command and an address of target data through the first channel CH1 , and the first processing unit group 120 may transmit an address indicating a location of the second memory cell area 170, to which the target data of the first memory cell area 160 are to be copied, to the memory device 150 through the second channel CH2.

In operation S220, the memory device 150 may copy data stored in the first memory cell area 160 to the second memory cell area 170, based on the copy command and the address transmitted through the first channel CH1 . For example, the first row decoder 184 and the first column decoder 185 may select memory cells corresponding to the address transmitted through the first channel CH1 , and the first data buffer 186 may transmit data read from the selected memory cells to the second data buffer 196. Then, the second row decoder 194 and the second column decoder 195 may select memory cells corresponding to the address transmitted through the second channel CH2, and the second data buffer 196 may copy the data transmitted from the first data buffer 186 to the selected memory cells.

In operation S230, the SoC 110 may transmit the copy command for copying data from the second memory cell area 170 to the first memory cell area 160 to the memory device 150 through the second channel CH2. In an example embodiment, the second processing unit group 130 may transmit the copy command and an address of target data through the second channel CH2, and the second processing unit group 130 may transmit an address indicating a location of the first memory cell area 160, to which the target data of the second memory cell area 170 are to be copied, to the memory device 150 through the first channel CH1.

In operation S240, the memory device 150 may copy data stored in the second memory cell area 170 to the first memory cell area 160, based on the copy command and the address transmitted through the second channel CH2. For example, the second row decoder 194 and the second column decoder 195 may select memory cells corresponding to the address transmitted through the second channel CH2, and the second data buffer 196 may transmit data read from the selected memory cells to the first data buffer 186. Then, the first row decoder 184 and the first column decoder 185 may select memory cells corresponding to the address transmitted through the first channel CH1, and the first data buffer 186 may copy the data transmitted from the second data buffer 196 to the selected memory cells.

Figure 6:
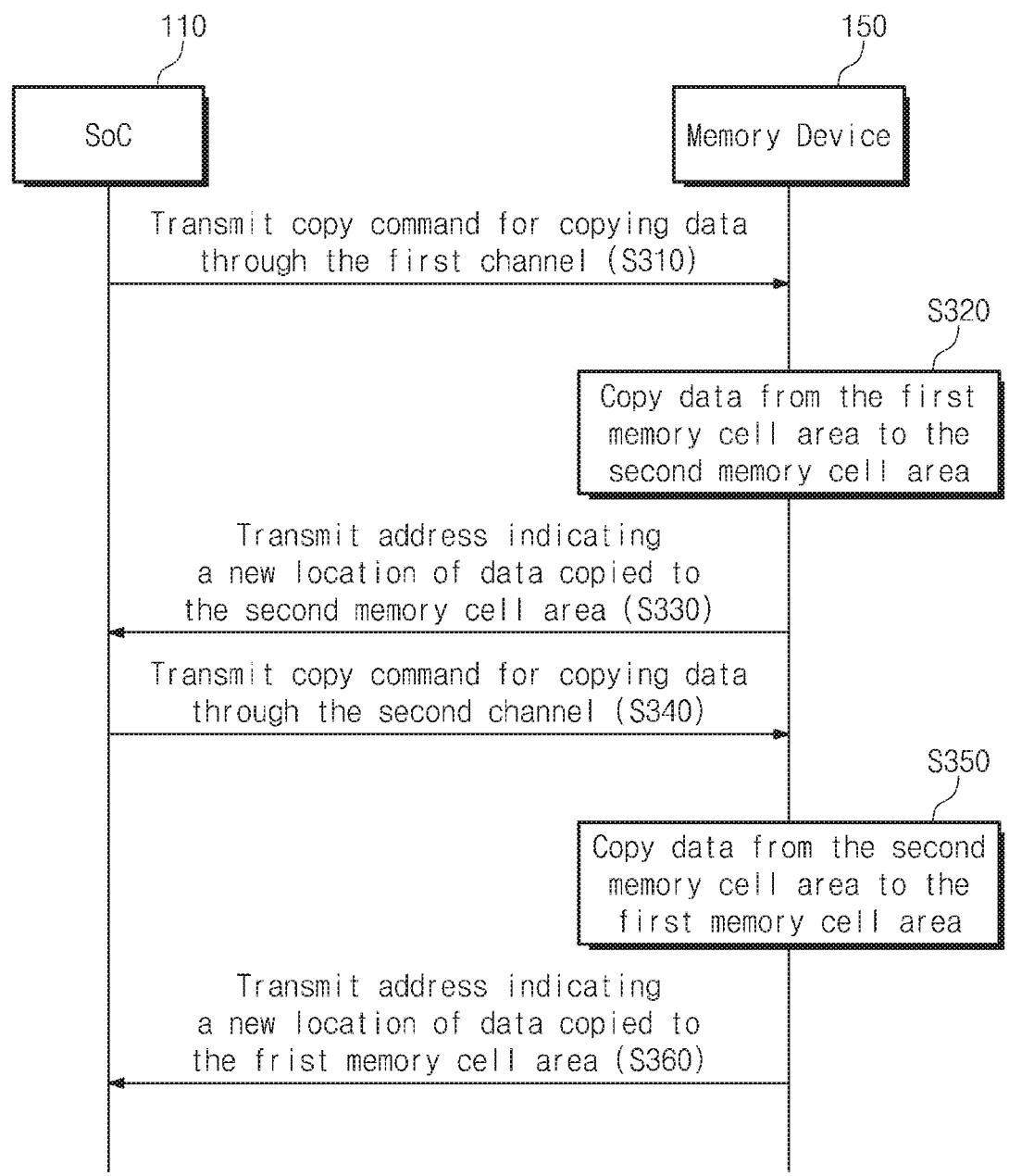
FIG. 6 is a flowchart illustrating an operating method of the electronic device according to another example embodiment of the inventive concepts.

FIG. 6 is a flowchart illustrating an operating method of an electronic device according to another example embodiment of the inventive concepts. FIG. 6 will be described with reference to FIGS. 1 to 3, and 5.

As in operation S210, in operation S310, the SoC 110 may transmit a copy command for copying data from the first memory cell area 160 to the second memory cell area 170 to the memory device 150 through the first channel CH1. Unlike operation S210, the first processing unit group 120 may not transmit an address indicating a location of the second memory cell area 170, to which data of the first memory cell area 160 are to be copied, to the memory device 150.

As in operation S220, in operation S320, the memory device 150 may copy data stored in the first memory cell area 160 to the second memory cell area 170, based on the copy command and the address transmitted through the first channel CH1. Unlike operation S220, the data stored in the first memory cell area 160 may be stored in any memory cells, in which data are not stored, of the second memory cell area 170.

In operation S330, the memory device 150 may transmit, to the first processing unit group 120 of the SoC 110, an address indicating a location of data copied to the second memory cell area 170 through one of the first channel CH1 and the second channel CH2. That is, the memory device 150 may determine a location of the second memory cell area 170, to which data of the first memory cell area 160 are to be copied, based on the copy command received in operation S310.

As in operation S230, in operation S340, the SoC 110 may transmit the copy command for copying data from the second memory cell area 170 to the first memory cell area 160 to the memory device 150 through the second channel CH2. Unlike operation S230, the second processing unit group 130 may not transmit an address indicating a location of the first memory cell area 160, to which data of the second memory cell area 170 are to be copied, to the memory device 150.

As in operation S240, in operation S350, the memory device 150 may copy data stored in the second memory cell area 170 to the first memory cell area 160, based on the copy command and the address transmitted through the second channel CH2. Unlike operation S240, the data stored in the second memory cell area 170 may be stored in any memory cells, in which data are not stored, of the first memory cell area 160.

In operation S360, the memory device 150 may transmit, to the second processing unit group 130 of the SoC 110, an address indicating a location of data copied to the first memory cell area 160 through one of the first channel CH1 and the second channel CH2. That is, the memory device 150 may determine a location of the first memory cell area 160, to which data of the second memory cell area 170 are to be copied, based on the copy command received in operation S340.

Figure 7:
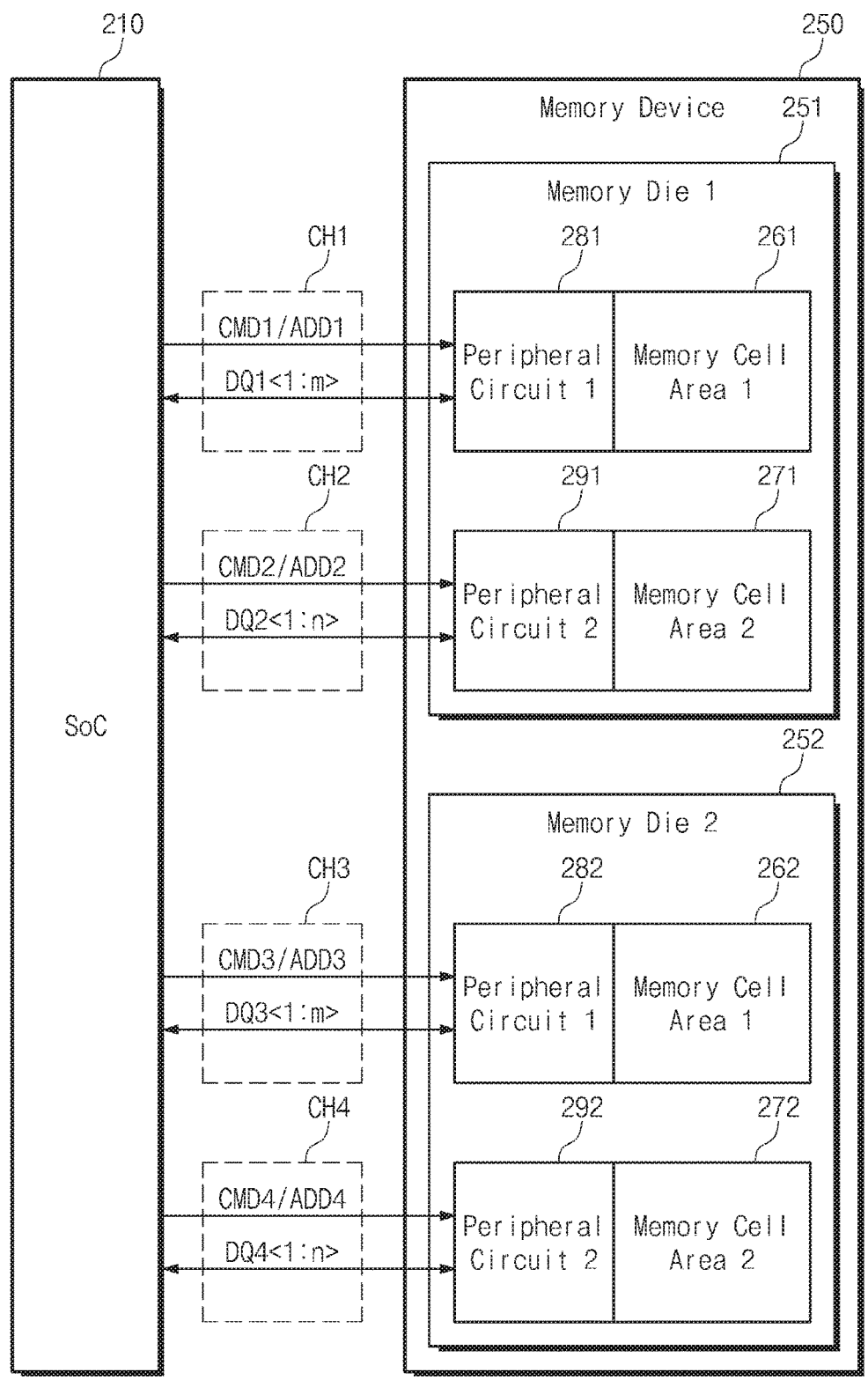
FIG. 7 is a block diagram illustrating the electronic device according to another example embodiment of the inventive concepts.

FIG. 7 is a block diagram illustrating an electronic device according to another example embodiment of the inventive concepts. FIG. 7 will be described with reference to FIGS. 1 to 3. Referring to FIG. 7, an electronic device 200 may include a SoC 210 and a memory device 250. The SoC 210 may be implemented to be substantially the same as the SoC 110 described with reference to FIGS. 1 to 6.

The memory device 250 may include a first memory die 251 and a second memory die 252. Each of the first memory die 251 and the second memory die 252 may be implemented to be substantially the same as the memory device 150 of FIG. 3, and the first memory die 251 and the second memory die 252 may be implemented to be substantially the same as each other. That is, the memory device 150 of FIG. 3 relates to the case where the number of memory dies is "1", and the memory device 250 of FIG. 7 relates to the case where the number of memory dies is "2" or more. The number of memory dies of the memory device 250 according to an example embodiment of the inventive concepts is not limited to illustration, and may further increase depending on a data size and a storage capacity that the SoC 210 requires.

The first memory die 251 may include a first memory cell area 261, a second memory cell area 271, a first peripheral circuit 281, and a second peripheral circuit 291. The second memory die 252 may include a first memory cell area 262, a second memory cell area 272, a first peripheral circuit 282, and a second peripheral circuit 292. The peripheral circuits 281, 291, 282, and 292 may respectively receive commands from the SoC 210 through first to fourth channels CH1 to CH4 and may respectively transmit processing results of the commands to the SoC 210 through the first to fourth channels CH1 to CH4.

In detail, the first peripheral circuit 281 may receive a first command/address CMD1/ADD1 from a first processing unit group of the SoC 210 through the first channel CH1 and may transmit and receive first data input/output signals DQ1<1:m> through the first channel CH1. As in the above description, the first peripheral circuit 282 may receive a third command/address CMD3/ADD3 from the first processing unit group of the SoC 210 through the third channel CH3 and may transmit and receive third data input/output signals DQ3<1:m> through the third channel CH3.

The second peripheral circuit 291 may receive a second command/address CMD2/ADD2 from a second processing unit group of the SoC 210 through the second channel CH2 and may transmit and receive second data input/output signals DQ2<1:n> through the second channel CH2. As in the above description, the second peripheral circuit 292 may receive a fourth command/address CMD4/ADD4 from the second processing unit group of the SoC 210 through the fourth channel CH4 and may transmit and receive fourth data input/output signals DQ4<1:n> through the fourth channel CH4.

The memory device 250 including the first memory die 251 and the second memory die 252 may be implemented by using various semiconductor packages. For example, a semiconductor package may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP). Also, the SoC 210 may be implemented by using the above semiconductor packages.

Figure 8:
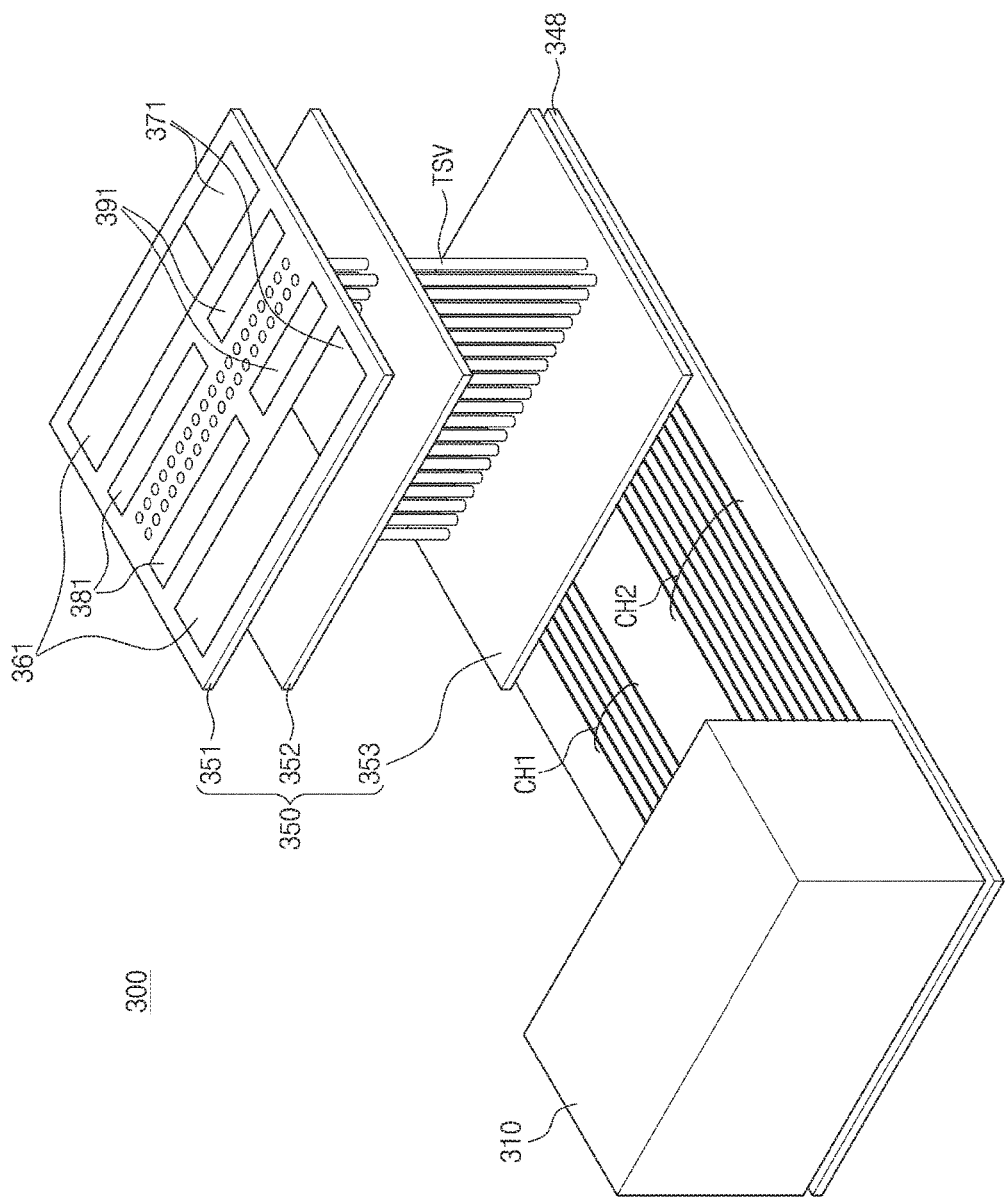
FIG. 8 is a block diagram illustrating the electronic device according to another example embodiment of the inventive concepts.

FIG. 8 is a block diagram illustrating an electronic device according to another example embodiment of the inventive concepts. FIG. 8 will be described with reference to FIGS. 1 to 3. Referring to FIG. 8, an electronic device 300 may include a SoC 310, a substrate 348, and a memory device 350.

The SoC 310 may be disposed on one surface of the substrate 348, and solder balls or bumps may be disposed on one surface of the SoC 310. The SoC 310 and the substrate 348 may be electrically connected to each other through the solder balls or the bumps. The SoC 310 may be implemented to be substantially the same as the SoC 110 described with reference to FIGS. 1 to 6.

The substrate 348 may provide an input/output path between the SoC 310 and the memory device 350. For example, the substrate 348 may be a printed circuit board, a flexible circuit board, a ceramic substrate, or an interposer. In the case where the substrate 348 is the interposer, the substrate 348 may be implemented by using a silicon wafer. A plurality of transmission lines may be implemented within the substrate 348.

The substrate 348 may provide transmission lines for the first channel CH1 and the second channel CH2 described with reference to FIGS. 1 to 3. Referring to FIG. 8, transmission lines forming the first channel CH1 and transmission lines forming the second channel CH2 are illustrated. As described above, the bandwidth of the second channel CH2 and the bandwidth of the first channel CH1 may be different from each other. For example, referring to FIG. 8, the bandwidth of the second channel CH2 may be higher than the bandwidth of the first channel CH1, and the number of transmission lines forming the second channel CH2 may be the same as or more than the number of transmission lines forming the first channel CH1.

However, the number of transmission lines illustrated in FIG. 8, the number of transmission lines of the first channel CH1, and the number of transmission lines of the second channel CH2 are only exemplary. The transmission lines of the substrate 348 may form three or more channels.

The memory device 350 may include a plurality of memory dies stacked in a vertical direction. For example, the memory device 350 may be a high bandwidth memory (HBM) device providing a high bandwidth. The memory device 350 may be disposed on the one surface of the substrate 348, on which the SoC 310 is disposed. Solder balls or bumps may be disposed on one surface of the memory device 350. The memory device 350 and the substrate 348 may be electrically connected to each other through the solder balls or the bumps. Referring to FIG. 8, the memory device 350 may include first and second memory dies 351 and 352, a buffer die 353, and through silicon vias TSVs.

The through silicon vias may provide electrical paths between the first and second memory dies 351 and 352 and the buffer die 353. The first and second memory dies 351 and 352 and the buffer die 353 may be electrically connected to each other by the through silicon vias. For example, the number of through silicon vias may be several hundreds to several thousands, and the through silicon vias may be arranged in a matrix form.

The first memory die 351 may include a first memory cell area 361, a second memory cell area 371, a first peripheral circuit 381, and a second peripheral circuit 391. Also, the first memory die 351 may include an area where the through silicon vias are disposed. The first memory cell area 361, the second memory cell area 371, the first peripheral circuit 381, and the second peripheral circuit 391 may be divided and disposed with respect to the area where the through silicon vias are disposed.

The first peripheral circuit 381 may access the first memory cell area 361 in response to a command transmitted from the SoC 310 through the first channel CH1 of the substrate 348, the buffer die 353, and the through silicon vias. The first peripheral circuit 381 may store, in the first memory cell area 361, data transmitted from the SoC 310 through the first channel CH1 of the substrate 348, the buffer die 353, and the through silicon vias or may transmit data stored in the first memory cell area 361 to the SoC 310 through the through silicon vias, the buffer die 353, and the first channel CH1 of the substrate 348. The second peripheral circuit 391 may communicate with the SoC 310 in a manner that is similar to the communication manner of the first peripheral circuit 381, but the second peripheral circuit 391 may communicate with the SoC 310 through the second channel CH2, not the first channel CH1.

As described with reference to FIG. 3, the capacity of the first memory cell area 361 and the capacity of the second memory cell area 371 may be different from each other, and an access speed of the first peripheral circuit 381 and an access speed of the second peripheral circuit 391 may be different from each other. For example, as described with reference to FIG. 8, the capacity of the second memory cell area 371 may be smaller than the capacity of the first memory cell area 361, but the access speed of the second peripheral circuit 391 may be higher than the access speed of the first peripheral circuit 381. Components of the first peripheral circuit 381 may be similar to the components of the first peripheral circuit 180 of FIG. 3, and components of the second peripheral circuit 391 may be similar to the components of the second peripheral circuit 190 of FIG. 3.

The second memory die 352 may be implemented to be the same as the first memory die 351. An example embodiment is illustrated in FIG. 8 as the memory device 350 includes the two memory dies 351 and 352, but more memory dies may be stacked in the memory device 350.

In an example embodiment, the SoC 310 may equally or independently set operation modes of the first and the second memory dies 351 and 352 and the capacities of the first and second memory cell areas 361 and 371. For example, according to settings of the SoC 310, the capacity of the first memory cell area 361 of the first memory die 351 may be the same as or different from the capacity of a first memory cell area of the second memory die 352. As in the above description, the capacity of the second memory cell area 371 of the first memory die 351 may be the same as or different from the capacity of a second memory cell area of the second memory die 352.

The buffer die 353 may include circuits for driving the first and second memory dies 351 and 352 through the through silicon vias. The buffer die 353 may transmit a command, an address, data, and the like to the first and second memory dies 351 and 352 through the through silicon vias and may receive data from the first and second memory dies 351 and 352 through the through silicon vias. For example, the buffer die 353 may be referred to as a "logic die", "base die", or "controller die".

In an example embodiment, although not illustrated in FIG. 8, as in the first memory die 351, the buffer die 353 may further include a first memory cell area, a second memory cell area, a first peripheral circuit, and a second peripheral circuit. That is, the buffer die 353 may also provide a first memory cell area assigned to the first channel CH1 and a second memory cell area assigned to the second channel CH2 to a first processing unit group and a second processing unit group of the SoC 310, respectively.

Figure 9:
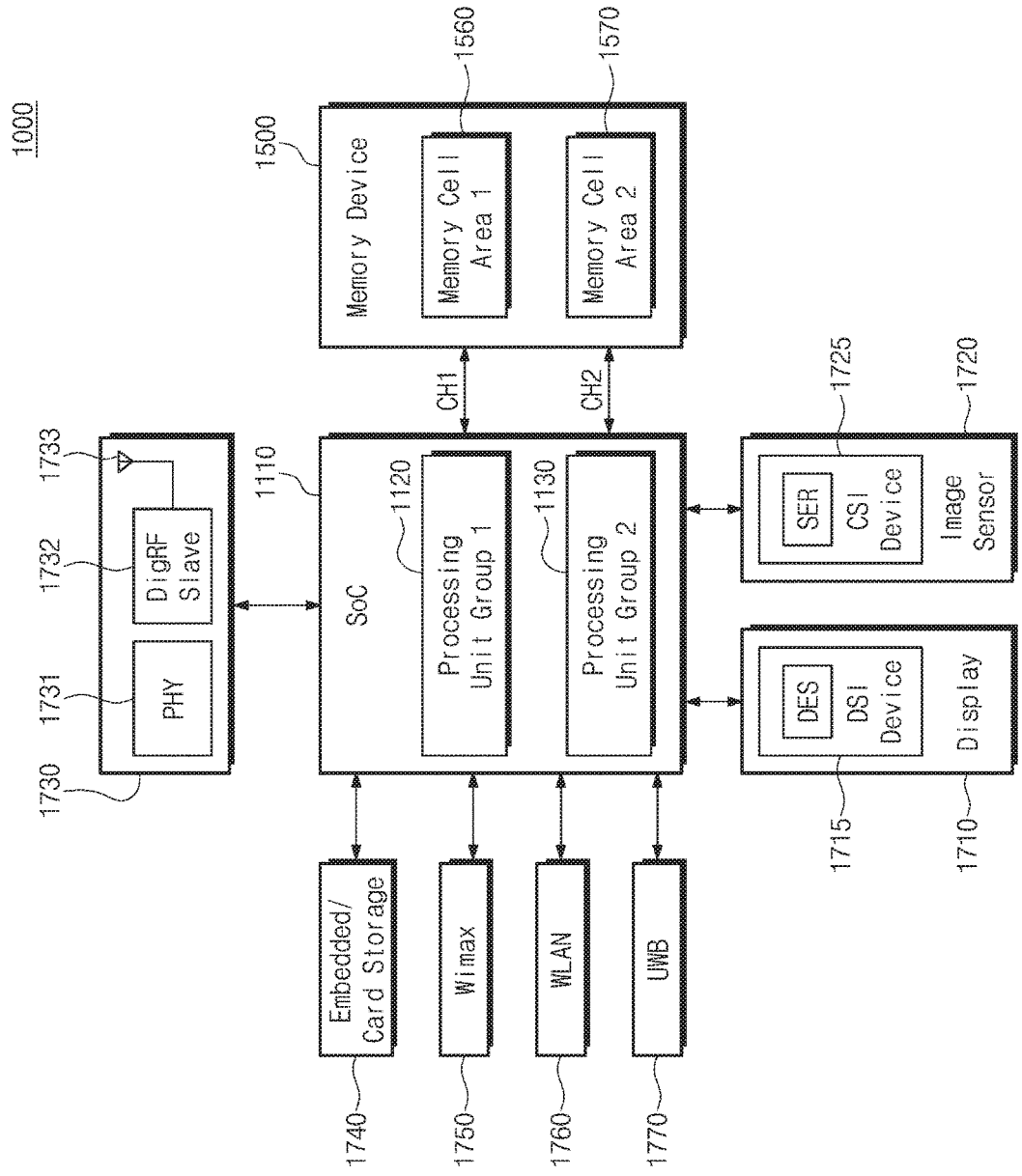
FIG. 9 is a block diagram illustrating the electronic device according to another example embodiment of the inventive concepts.

FIG. 9 is a block diagram illustrating an electronic device according to another example embodiment of the inventive concepts. An electronic device 1000 may be implemented with an electronic device capable of using or supporting interfaces proposed by mobile industry processor interface (MIPI) alliance. For example, the electronic device 1000 may be, but is not limited to, one of a server, a computer, a smartphone, a tablet, personal digital assistant (PDA), a digital camera, a portable multimedia player (PMP), a wearable device, an Internet of things (Iot) device, and the like.

The electronic device 1000 may include a SoC 1100 and a memory device 1500. The SoC 1100 may include a first processing unit group 1120 and a second processing unit group 1130, and may be implemented to be substantially the same as the SoC 110, 210, or 310 described with reference to FIGS. 1 to 7. The memory device 1500 may include a first memory cell area 1560 and a second memory cell area 1570, and may be implemented to be substantially the same as the memory device 150, 250, or 350 described with reference to FIGS. 1 to 7.

The electronic device 1000 may include a display 1710 communicating with the SoC 1100. The SoC 1100 may communicate with a display serial interface (DSI) device 1715 through a DSI. For example, an optical deserializer DES may be implemented in the DSI device 1715.

The electronic device 1000 may include an image sensor 1720 communicating with the SoC 1100. The SoC 1100 may communicate with a camera serial interface (CSI) device 1725 through a CSI. For example, an optical serializer SER may be implemented in the CSI device 1725.

The electronic device 1000 may further include a radio frequency (RF) chip 1730 that communicates with the SoC 1100. The RF chip 1730 may include a physical layer 1731, a DigRF slave 1732, and an antenna 1733. For example, the physical layer 1731 of the RF chip 1730 and the SoC 1100 may exchange data with each other through a DigRF interface proposed by the MIPI alliance.

The electronic device 1000 may further include embedded/card storage 1740. The embedded/card storage 1740 may store data provided from the SoC 1100 and may permanently store data provided from the memory device 1500. The electronic device 1000 may communicate with an external system through worldwide interoperability for microwave access (WiMAX) 1750, a wireless local area network (WLAN) 1760, ultra wide band (UWB) 1770, and the like.

In addition to the components illustrated in FIG. 9, any other components (e.g., a speaker, a microphone, a GPS, and the like) may be further included in the electronic device 1000. As functions that the electronic device 1000 supports increase, many components should be disposed in the limited area of the electronic device 1000. According to an example embodiment of the inventive concepts, the SoC 1100 may communicate with the one memory device 1500 through at least two channels, instead of communicating with memory devices, of which the bandwidths and transmission speeds are different from each other. The memory device 1500 may provide memory areas, of which the bandwidths and transmission speeds are different from each other. Accordingly, the area and costs of the electronic device 1000 may be reduced.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. An electronic device comprising:
   a memory device including:
      a first memory cell area assigned to a first channel;
      a second memory cell area assigned to a second channel;
      a first row decoder configured to select a first word line of the first memory cell area;
      a first column decoder configured to select a first column select line of the first memory cell area;
      a second row decoder configured to select a second word line of the second memory cell area; and
      a second column decoder configured to select a second column select line of the second memory cell area; and
   a system on chip (SoC) including a first processing unit and a second processing unit, the first processing unit configured to transmit a first command for accessing the first memory cell area to the memory device through the first channel, and the second processing unit configured to transmit a second command for accessing the second memory cell area to the memory device through the second channel,
   wherein the memory device is configured such that the first channel has a first bandwidth, the second channel has a second bandwidth, and the first and second bandwidths are different.

2. The electronic device of claim 1, wherein the memory device further comprises:
   first data input/output pins configured to input or output first data through the first channel, the first data being exchanged between the SoC and the first memory cell area; and
   second data input/output pins configured to input or output second data through the second channel, the second data being exchanged between the SoC and the second memory cell area.

3. The electronic device of claim 2, wherein the second bandwidth of the second channel is higher than the first bandwidth of the first channel, and
   wherein a number of the second data input/output pins is more than a number of the first data input/output pins.

4. The electronic device of claim 2, wherein the second bandwidth of the second channel is higher than the first bandwidth of the first channel, and
   wherein the memory device is configured such that a transmission speed at which the second data are transmitted through the second data input/output pins is higher than a transmission speed at which the first data are transmitted through the first data input/output pins.

5. The electronic device of claim 1, wherein the first processing unit is one of a central processing unit (CPU), an image signal processing unit (ISP), and a digital signal processing unit (DSP).

6. The electronic device of claim 1, wherein the second processing unit is one of a graphics processing unit (GPU), a vision processing unit (VPU), and a neural processing unit (NPU).

7. The electronic device of claim 1, wherein the SoC is configured to transmit set commands setting a capacity of the first memory cell area and a capacity of the second memory cell area to the memory device.

8. The electronic device of claim 1, wherein the SoC is further configured to transmit a copy command to the memory device through the first channel or the second channel such that data are copied from the first memory cell area to the second memory cell area or such that data are copied from the second memory cell area to the first memory cell area.

9. A memory device comprising:
a memory cell array including a first memory cell area and a second memory cell area;
a first peripheral circuit configured to access the first memory cell area, in response to a first command transmitted from a system on chip (SoC) through a first channel; and
a second peripheral circuit configured to access the second memory cell area, in response to a second command transmitted from the SoC through a second channel,
wherein the first peripheral circuit includes first data input/output pins, the first peripheral circuit configured to exchange first data with the SoC by inputting or outputting the first data through the first input/output pins,
wherein the second peripheral circuit includes second data input/output pins, the second peripheral circuit configured to exchange second data with the SoC by inputting or outputting the second data through the second input/output pins,
wherein the first peripheral circuit and the second peripheral circuit are configured such that the first channel has a first bandwidth, the second channel has a second bandwidth, and the first and second bandwidths are different,
wherein the first peripheral circuit further includes a first row decoder configured to select a first word line of the first memory cell area and a first column decoder configured to select a first column select line of the first memory cell area, and
wherein the second peripheral circuit further includes a second row decoder configured to select a second word line of the second memory cell area and a second column decoder configured to select a second column select line of the first memory cell area.

10. The memory device of claim 9, wherein the first peripheral circuit and the second peripheral circuit are configured such that the second bandwidth is higher than the first bandwidth, and
wherein a capacity of the second memory cell area is smaller than a capacity of the first memory cell area.

11. The memory device of claim 10, wherein the first peripheral circuit and the second peripheral circuit are configured such that an access speed at which the second peripheral circuit accesses the second memory cell area is higher than an access speed at which the first peripheral circuit accesses the first memory cell area.

12. The memory device of claim 9, wherein the first peripheral circuit further includes a first mode register configured to store a first setting value transmitted from the SoC to set the first memory cell area of the memory cell array, and
wherein the second peripheral circuit further comprises a second mode register configured to store a second setting value transmitted from the SoC to set the second memory cell area of the memory cell array.

13. The memory device of claim 9, wherein
the first peripheral circuit further includes a third mode register configured to store a third setting value transmitted from the SoC to set a first burst length for the first channel, and
the second peripheral circuit further includes a fourth mode register configured to store a fourth setting value transmitted from the SoC to set a second burst length for the second channel.

14. The memory device of claim 9, wherein
the first peripheral circuit is further configured to read copy data from the first memory cell area and transmit the copy data to the second peripheral circuit, based on a copy command transmitted through the first channel, and
the second peripheral circuit is further configured to store the copy data in the second memory cell area.

15. The memory device of claim 9, wherein
the second peripheral circuit is further configured to read copy data from the second memory cell area and transmit the copy data to the first peripheral circuit, based on a copy command transmitted through the second channel, and
the first peripheral circuit is further configured to store the copy data in the first memory cell area.

16. An operating method of an electronic device comprising a memory device and a system on chip (SoC) communicating with the memory device, the method comprising:
assigning a first memory cell area of the memory device to a first channel between the SoC and the memory device and assigning a second memory cell area of the memory device to a second channel between the SoC and the memory device;
performing first data input/output between the SoC and the memory device, based on a first command transmitted to the memory device from the SoC through the first channel; and
performing second data input/output between the SoC and the memory device, based on a second command transmitted to the memory device from the SoC through the second channel,
wherein the first channel has a first bandwidth, the second channel has a second bandwidth, and the first and second bandwidths are different, and
wherein the memory device includes:
a first row decoder configured to select a first word line of the first memory cell area;
a first column decoder configured to select a first column select line of the first memory cell area;
a second row decoder configured to select a second word line of the second memory cell area; and
a second column decoder configured to select a second column select line of the second memory cell area.

17. The method of claim 16, further comprising:
copying data of the first memory cell area to the second memory cell area, based on a copy command transmitted to the memory device from the SoC through the first channel.

18. The method of claim 16, further comprising:
copying data of the second memory cell area to the first memory cell area, based on a copy command transmitted to the memory device from the SoC through the second channel.

19. The method of claim 16, further comprising:
assigning a portion of the first memory cell area assigned to the first channel to the second channel or assigning a portion of the second memory cell area assigned to the second channel to the first channel.

20. The method of claim 16, further comprising:
setting an operation mode of the first memory cell area through the first channel or setting an operation mode of the second memory cell area through the second channel.

* * * * *